United States Patent [19]

Siebert

[11] 3,978,941

[45] Sept. 7, 1976

[54] SPEAKER ENCLOSURE

[76] Inventor: Curt August Siebert, 4711 NW. 24th Court, Apt. 108, Lauderdale Lakes, Fla. 33313

[22] Filed: June 6, 1975

[21] Appl. No.: 584,617

[52] U.S. Cl. ................................ 181/151; 181/153; 181/156

[51] Int. Cl.² ........................................ H05K 5/00

[58] Field of Search ........... 181/155, 156, 199, 144, 181/151–153, 198, 163, 148, 146, 160; 179/1 E; 312/7 R

[56] References Cited

UNITED STATES PATENTS

| | | | |
|---|---|---|---|
| 1,869,178 | 7/1932 | Thuras | 181/160 |
| 2,713,396 | 7/1955 | Tavares | 181/199 |
| 2,834,423 | 5/1958 | Bradford | 181/156 |
| 3,037,081 | 5/1962 | Carlsson | 181/148 X |
| 3,371,742 | 3/1968 | Norton et al. | 181/153 |
| 3,667,568 | 6/1972 | Liebscher | 181/156 |
| 3,727,719 | 4/1973 | Yando | 179/1 E |

FOREIGN PATENTS OR APPLICATIONS

| | | | |
|---|---|---|---|
| 1,032,774 | 6/1966 | United Kingdom | 179/1 E |

*Primary Examiner*—John Gonzales
*Attorney, Agent, or Firm*—Malin & Haley

[57] ABSTRACT

An improved speaker enclosure for providing an acoustical balanced output with improved audio quality at low level reproduction. The enclosure includes a low sonic frequency pressure induced sonic wave amplification resulting from in phase reflection mechanically of re-induced resonant pressure waves. The invention comprises a speaker chamber of improved construction, the speaker being placed across one end, with the opposite end of the chamber being closed by an elastic diaphragm having an acoustic non-resonant tube centrally disposed protruding into the chamber, allowing the flow of air from inside the chamber enclosure to the outside atmosphere. The elastic diaphragm which is mounted at the chamber end opposite from the speaker mounting provides for mechanical reflection of low frequency acoustical waves, the dimensions of the speaker enclosure and the resonant tube being sized to produce an additive effect on low frequency acoustic waves which increases the dynamic amplitude of the low frequency response of the device. The non-resonant tube is disposed on the center axis of the chamber and is sized to allow a certain amount of air emission from the chamber itself.

5 Claims, 3 Drawing Figures

SPEAKER ENCLOSURE

BACKGROUND OF THE INVENTION

This invention relates generally to a speaker enclosure, and more specifically to a speaker enclosure having improved dynamic characteristics resulting in improved quantitative and qualitative reproduction of sound from a loud speaker or the like, the device being characterized by non-complex construction and improvement of the audio characteristics of speakers conventionally found today. The device is especially useful for housing what would normally be considered inexpensive speakers to provide excellent quality and reproduction.

In the past, several attempts have been made to increase the quality of sound from speakers through variations in the speaker enclosure. Many problems have been encountered with the speaker enclosure because the backward movement of the speaker diaphragm builds up a pressure wave similar to that which is radiated forward, the energy of which is expended in the speaker enclosure chamber. Other problems of resonant frequency with the materials involved and the attenuation of energy in the speaker enclosure have been encountered, the total effect of which affects the quality and the accuracy of the speaker sound output. Sonic energy imparted to air within the speaker enclosure chamber affects the speaker cone itself in its vibrations and thus must be considered in determining the effective and qualitative output of the speaker. The instant invention provides for an improved qualitative output of acoustic waves from a conventional speaker by utilizing a novel reflective elastic diaphragm on the side opposite the speaker back in conjunction with an air venting non-resonant tube disposed in conjunction with the elastic diaphragm. The device includes the use of a steel or other material having a predetermined elasticity for the construction of the chamber walls themselves.

BRIEF DESCRIPTION OF THE INVENTION

The invention utilizes a speaker enclosure which comprises a conventional speaker disposed within a non-resonant shell (which in one embodiment is a cylindrical tube) with the speaker disposed across the diameter of the tube interior. Enclosing the end opposite the speaker mounting is an elastic diaphragm which may be made of steel or the like which is sufficiently flexible to reverberate with acoustical low frequency waves to provide a predetermined amount of positive reinforcement of sound waves back to the speaker diaphragm surface. Coupled around an aperture in the elastic diaphragm is a non-resonant venting tube with a narrow constrictive passage which allows a finite volume of air to flow in and out of the enclosed chamber area. The length and cross-sectional opening of the venting tube is a function of the length of the chamber from the speaker to the opposite elastic diaphragm closure wall, with the sizes of these elements being chosen to provide an additive amplitude (in proper phase) of the frequencies which are reflected from the opposite end of the speaker enclosure back to the speaker diaphragm wall itself. The speaker is conventionally mounted within the cylindrical shell by rubber or other elastic materials. A protective screen may be placed over the open end of the enclosure if desired. The inner circumferential walls of the chamber 12 are covered with a sound absorbent material, the material being conventional within the art. The dimensional ratios of the outer shell diameter which houses a conventional speaker of a particular diameter, the distance from the speaker position along the shell longitudinally and axially to the opposite end closure, and the tube vent length and interior diameter opening are ascertained with respect to the specific type of material utilized for the elastic diaphragm which forms the reflective wall opposite the inner portion of the speaker.

In operation, Applicant has determined through quantitative and qualitative testing that utilizing a conventional speaker with Applicant's enclosure, the output quality of the speaker is materially improved while the output energy of the speaker for low frequency is improved utilizing the same amount of wattage for driving the speaker.

It is an object of this invention to provide an improved speaker enclosure.

It is another object of this invention to provide an improved speaker enclosure which improves the acoustic output characteristics of the speaker utilizing a conventional speaker with a speaker enclosure of non-complex design and structure.

Yet still another object of this invention is to provide a speaker enclosure having an elastic diaphragm on a wall opposite the speaker mounting which provides for reflective additive in-phase energy receipt at the speaker diaphragm for improved acoustical quality of the speaker.

But still yet another object of this invention is to provide a speaker enclosure which may be constructed of metal or other similar behavioral material having improved acoustical output qualities.

In accordance with these and other objects which will be apparant hereinafter, the instant invention will now be described with particular reference to the accompanying drawings.

PREFERRED EMBODIMENT OF THE INVENTION

Figure 1:
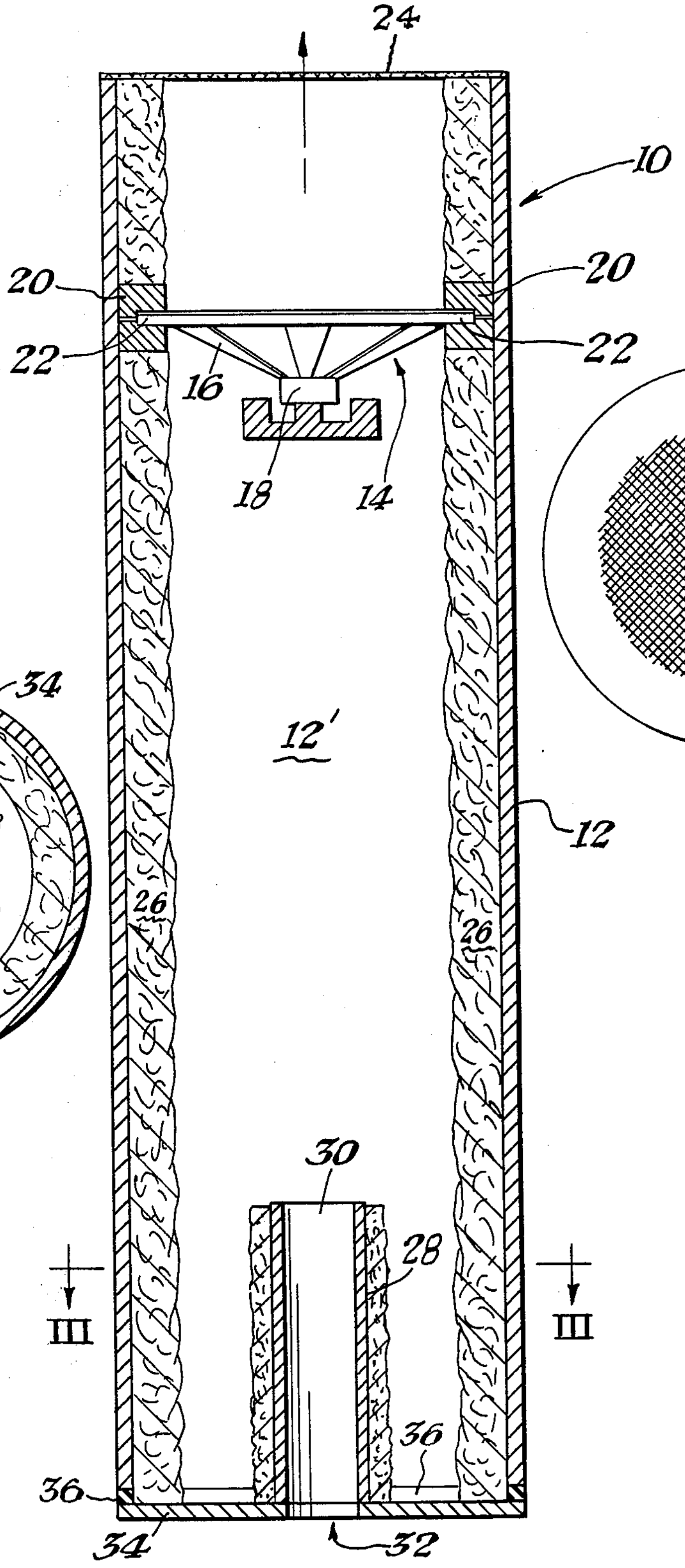
FIG. 1 shows a speaker enclosure including a conventional speaker in a elevational cross-section in accordance with Applicant's invention.

Referring now to the drawings and especially FIG. 1, Applicant's improved speaker enclosure is shown generally at 10 comprising an outer cylindrical shell 12 (forming an interior chamber 12') across the inside diameter of which is mounted a conventional speaker 14. The speaker 14 is mounted to the inside circumference walls of chamber 12' by conventional elastic rubber mounting strips 20 which are ring-shaped and formed and connected to the circumferential speaker frame 22. The standard conventional speaker diaphragm 16 is connected to the frame exterior ring 22 and to the transducer electro-mechanical vibrating means which may be an electro-magnet coil 18. The other wires utilized to drive the acoustical speaker are not shown for the sake of clarity. The speaker as shown is circular and provides an enclosure across the entire inner diameter chamber 12'. At the upper end of the outer shell 12 is placed a protective screen 24 which does not affect the acoustical output of the device.

The inner walls of the cylindrical shell may be covered with an acoustically absorbent material 26 which is standard and well-known in the art.

At the end opposite the speaker mounting within the shell 12 is a circular plate 34 which is an elastic diaphragm forming a closure across the bottom end of the shell chamber 12. Disposed centrally within an aperture 32 in the elastic diaphragm plate 34 is a venting tube 28, the longitudinal axis of which is in the direction of the speaker 14. The tube has a passageway opening 30 which allows for the transfer of air from the inside of chamber 12' to the outer atmosphere.

The outer shell 12 is constructed of a metallic or other material if desired. The elastic diaphragm is constructed of an elastic material which is flexibly responsive to low frequency acoustical waves and as shown in the preferred embodiment may be a flexible steel plate 34. The venting tube 28 may be made of cardboard or other similar material.

EXAMPLE I

In one example constructed by the Applicant, the outer shell is made of a metal with the inner coating and acoustical material being provided. The axial longitudinal length of the shell cavity was 36 inches long with the distance from the speaker to the open end screen 24 being 6 inches. The diameter of the shell was selected as 9 inches with an 8 inch speaker being mounted therein. The vent tube is constructed to be 5 inches long along its longitudinal length with the diameter of the vent tube being 1.5 inches. A metal diaphragm with elastic metal 34 was utilized. The action of the elastic diaphragm 34 with these dimensions in conjunction with the venting tube 28 produced exceptionally improved qualitative acoustical results utilizing a very inexpensive conventional loud speaker. The speaker was also installed in other standard speaker enclosures. The results were compared, with definite sound differences being produced, with Applicant's invention producing improved quantitative and qualitative acoustically tonal characteristics.

The speaker enclosure is mounted above a surface so that the elastic diaphragm on the bottom is not directly contacting the surface upon which it rests. The theory of operation of the instant invention as it is best understood by the Applicant is that the cooperation between the elastic diaphragm and the energy from the speaker cone work together to produce particular resonance frequencies below the audio range which are disseminated in the particular surrounding area and room where the speaker is located such that the resonant frequencies emitted by the diaphragm which are below the audio range nevertheless affect, through harmonics and in conjunction with the audio frequency notes emitted from the speaker, to produce a frequency interaction which enriches the tonal quality for the listener. The instant invention provides a maximum energy transfer to the area around the enclosure with increased efficiency from the push-pull action of the cooperation between the speaker cone and the elastic diaphragm. The nature of the elasticity of the steel diaphragm is such that there will be a resonant reverburation of the elastic metal plate at three cycles of sonic frequency. The internal insulation within the speaker housing absorbs the high frequency output of the speaker itself so that only the lower frequencies will be available to affect the elastic diaphragm. Various materials for the diaphragm which have been found to produce satisfactory results are 28 or 30 gage galvanized metal or 16 gage stainless steel. The speaker housing, in conjunction with what may be termed "a low cost speaker", provides for maximum reinforcement below 300 cycles. The basic operation of the invention is dependent upon the elasticity of the metal diaphragm or a substitute material having the same elastic properties of 16 gage stainless or 28 gage galvanized metal by inside pressure loading changes of frequency differences which produce a 3 cycle per second reverberation or resonant frequency in the particular metal diaphragm. Other materials may be substituted for the metal diaphragm but the particular characteristics of the material must be such to have the same elasticity and must be able to withstand continuous vibration without rapid deterioration or other undesirous side affects which would act to destroy the diaphragm. The particular kind of material for the walls of the chamber are not considered important to the operation of the device except that the insulation is essential for removing and dampening higher frequencies above 300 cycles. The particular leg size of the example disclosed is 4 inches, allowing for wave energy transmittal from the diaphragm outside the enclosure to the surrounding area. The diaphragm is attached to the walls of the housing in such a way as to prevent any interaction of vibration between the shell walls and the diaphragm. A resilient adhesive material connects the diaphragm plate itself to the shell housing. In one embodiment, this could be a rubber-type adhesive which is affixed around the peripheral edge of the diaphragm to adhesively and resiliently attach the diaphragm to the shell itself. Thus using a resilient adhesive, vibrations of the shell walls would not be transmitted to the diaphragm but will be absorbed in the resilient adhesive material and likewise vibrations of the diaphragm itself will not be received or restricted by the attachment to the housing but will be absorbed in the resilient adhesive material. Referring to the drawing, the diaphragm 34 is affixed to the speaker housing 12 by an adhesive resilient ring 36 which is coated around the base outside surface of the speaker shell 12 to which the plate or diaphragm 34 is attached. Non-resonant tube 28 is connected about aperture 32 with a resilient adhesive or epoxy bond.

In operation a substantial portion of the low frequency wave energy is from the speaker cone received and exerted upon the diaphragm which produces sound waves external of the housing itself and in an out of phase relationship to the wave eminated from the speaker outwardly at the opposite end of the chamber which sets upon sonic waves in a push-pull fashion which excites surrounding areas of the speaker, such as walls, by causing them to act as a baffle to propogate lower frequency waves. This allows for a wide dispersion for low frequency waves to reduce the directional affects found in other sound systems.

Figure 2:
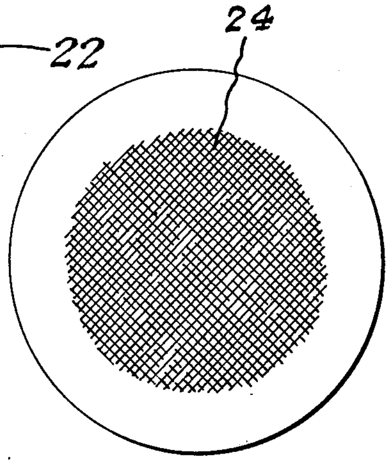
FIG. 2 shows a top plan view of the instant invention.
Figure 3:
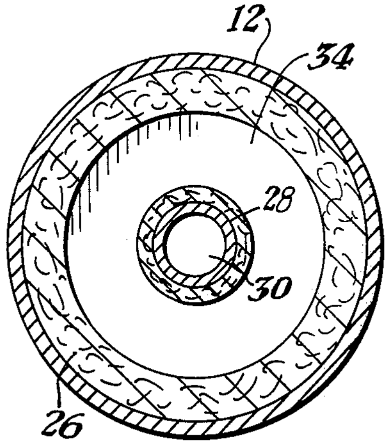
FIG. 3 shows a plan cross-sectional view taken along line III—III.

FIG. 2 shows the top screen covering the instant invention. FIG. 3 shows the circular construction of shell 12 and venting tube 28. The speaker enclosure shown in FIG. 1 is mounted on a plurality of legs (not shown).

The instant invention has been shown and described herein in what is considered to be the most practical and preferred embodiment. It is recognized, however, that departures may be made therefrom within the scope of the invention and that obvious modifications will occur to a person skilled in the art.

What I claim is:

1. An improved speaker enclosure comprising:

a tubular shaped enclosure body, insulating means disposed within said enclosure, conventional speaker coupled across and adjacent one end of said enclosure body;

a flexible diaphragm said diaphragm being flexibly, dynamically responsive to acoustical wave energy of a predetermined frequency and being disposed opposite said speaker enclosing said outer tubular body at one end, said diaphragm having an aperture disposed therethrough; and an elongated venting tube connected across said diaphragm aperture and disposed axially in the direction of said speaker within said enclosure chamber.

2. An improved sonic speaker housing comprising:

an elongated tubular enclosure having first and second open ends:

high frequency sonic energy insulating means disposed about the interior of said enclosure covering the interior walls of the enclosure completely;

a means coupled near said first open end of said enclosure for mounting an audio speaker across the first open end;

a flexible, acoustical energy responsive diaphragm elastically coupled to the second open end, covering said second open end of said enclosure, said diaphragm having a center aperture disposed therethrough, said diaphragm having a predetermined resonant vibrational acoustical characteristic frequency;

an elongated tube connected inside the said flexible diaphragm across said diaphragm aperture, said tube having a longitudinal axis disposed along the longitudinal axis of said enclosure.

3. An audio speaker enclosure, as in claim 2, wherein:

said flexible diaphragm consists of 28 gage galvanized metal.

4. An improved speaker enclosure, as in claim 2, wherein:

said flexible diaphragm consists of 16 gage stainless steel.

5. An improved speaker enclosure as in claim 2, wherein:

said elongated tube length is substantially four times longer than said diaphragm aperture diameter.

* * * * *